United States Patent
Chi et al.

(10) Patent No.: US 10,135,478 B2
(45) Date of Patent: Nov. 20, 2018

(54) WIDEBAND MILLIMETER-WAVE FRONTEND INTEGRATED CIRCUIT

(71) Applicant: SPEEDLINK TECHNOLOGY INC., Cupertino, CA (US)

(72) Inventors: Taiyun Chi, Atlanta, GA (US); Hua Wang, Atlanta, GA (US); Thomas Chen, Vancouver (CA)

(73) Assignees: SPEEDLINK TECHNOLOGY, INC., Cupertino, CA (US); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 16/005,472

(22) Filed: Jun. 11, 2018

(65) Prior Publication Data

US 2018/0294832 A1    Oct. 11, 2018

Related U.S. Application Data

(63) Continuation-in-part of application No. 15/484,037, filed on Apr. 10, 2017, now Pat. No. 10,014,901.

(51) Int. Cl.
*H04B 1/38* (2015.01)
*H04B 1/44* (2006.01)
(Continued)

(52) U.S. Cl.
CPC ............... *H04B 1/38* (2013.01); *H03F 3/195* (2013.01); *H03L 7/24* (2013.01); *H04B 1/44* (2013.01);
(Continued)

(58) Field of Classification Search
CPC .......... H03F 3/24; H03F 1/3241; H03F 3/195; H04B 1/0475; H04B 1/0082; H04B 1/7136; H04B 1/71635; H04B 1/005; H04B 1/406; H04B 1/006; H04B 1/0096; H04B 2001/0491; H04B 1/38; H04B 1/44; H03L 2207/50; H03L 7/08; H03L 7/24; H03L 7/093
See application file for complete search history.

(56) References Cited

U.S. PATENT DOCUMENTS 6,385,262 B1   5/2002  Gustafsson et al.
6,584,090 B1 * 6/2003  Abdelgany ............ H04B 1/005
                                                           370/342

(Continued)

*Primary Examiner* — Khanh C Tran
(74) *Attorney, Agent, or Firm* — Womble Bond Dickinson (US) LLP

(57) ABSTRACT

According to one embodiment, a millimeter-wave (mm-wave) frontend integrated circuit includes an array of mm-wave transceivers, where each of the mm-wave transceivers transmits and receives coherent mm-wave signals with variable amplitudes and phase shifts. The mm-wave frontend IC chip further includes a wideband frequency synthesizer coupled to the mm-wave transceivers. The full-based or wideband frequency synthesizer generates and provides a local oscillator (LO) signal to each of the mm-wave transceivers to enable the mm-wave transceiver to mix, modulate, and/or demodulate mm-wave signals. The array of mm-wave wideband transceivers and the wideband frequency synthesizer may be implemented within a single IC chip as a single mm-wave frontend IC chip or package.

20 Claims, 7 Drawing Sheets

(51) Int. Cl.
  *H03L 7/24* (2006.01)
  *H03F 3/195* (2006.01)
  *H04W 72/04* (2009.01)
  *H03L 7/08* (2006.01)
  *H03L 7/093* (2006.01)
(52) U.S. Cl.
  CPC ... *H04W 72/0453* (2013.01); *H03F 2200/451* (2013.01); *H03L 7/08* (2013.01); *H03L 7/093* (2013.01)

(56) References Cited

U.S. PATENT DOCUMENTS

| | | | |
|---|---|---|---|
| 7,251,459 B2* | 7/2007 | McFarland | H03H 7/0153 455/101 |
| 7,463,864 B2* | 12/2008 | Vassiliou | H04B 1/30 455/102 |
| 7,933,319 B2* | 4/2011 | Yen | H04B 1/38 375/219 |
| 8,868,126 B2 | 10/2014 | Chen et al. | |
| 2004/0204039 A1* | 10/2004 | Ogawa | H04B 1/006 455/553.1 |
| 2005/0020298 A1* | 1/2005 | Masumoto | H04B 1/005 455/552.1 |
| 2005/0048932 A1* | 3/2005 | Balasubramaniyan | H04B 1/406 455/93 |
| 2005/0059372 A1 | 3/2005 | Arayashiki et al. | |
| 2007/0021080 A1* | 1/2007 | Kuriyama | H04B 1/0057 455/132 |
| 2009/0156135 A1 | 6/2009 | Kamizuma et al. | |
| 2014/0184342 A1* | 7/2014 | Chang | H03B 21/02 331/2 |
| 2015/0139122 A1 | 5/2015 | Rimini et al. | |
| 2016/0308626 A1* | 10/2016 | Mow | H04B 17/14 |

* cited by examiner

WIDEBAND MILLIMETER-WAVE FRONTEND INTEGRATED CIRCUIT

RELATED APPLICATIONS

This application is a continuation-in-part (CIP) of co-pending U.S. patent application Ser. No. 15/484,037, filed Apr. 10, 2017, which is incorporated by reference herein in its entirety.

FIELD OF THE INVENTION

Embodiments of the present invention relate generally to mobile devices. More particularly, embodiments of the invention relate to a millimeter-wave (mm-wave) frontend module of a mobile device.

BACKGROUND

As wireless communications technologies evolve, multi-mode or multi-band wireless systems are routinely available. Such systems may partition different functions into different integrated circuit (IC) devices. For example, a wireless system may include a modem or a baseband processor, a transceiver, control circuitry, receive circuitry, transmit circuitry, or the like. Such multiple IC devices are sometimes inconvenient and cost ineffective.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
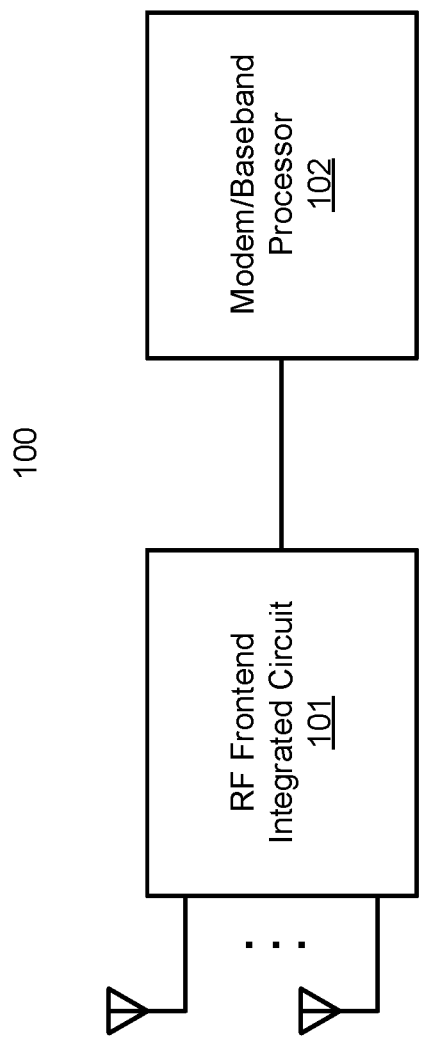
FIG. 1 is a block diagram illustrating an example of a wireless communication device according one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a millimeter-wave (mm-wave) frontend IC device includes an array of one or more mm-wave transceivers. Each of the mm-wave transceivers transmits and receives coherent mm-wave signals with variable amplitudes and phase shifts. The mm-wave frontend IC chip further includes a wideband frequency synthesizer coupled to the mm-wave transceivers. The full-based or wideband frequency synthesizer generates and provides a local oscillator (LO) signal to each of the mm-wave transceivers to enable the mm-wave transceiver to mix, modulate, and/or demodulate mm-wave signals. The array of mm-wave wideband transceivers and the wideband frequency synthesizer may be implemented within a single IC chip as a single mm-wave frontend IC chip or package.

The wideband frequency synthesizer includes a phase-lock loop (PLL) circuitry or block to generate the LO signal based on a clock reference signal, which may be provided by a local oscillator. Each mm-wave transceiver includes a full-band or wideband transmitter to transmit mm-wave signals and a full-band or wideband receiver to receive mm-wave signals within the frequency band (e.g., approximately ranging from 24 to 43 Giga hertz or GHz), and a transmitting and receiving (T/R) switch coupled to the transmitter and the receiver. The T/R switch is to couple an mm-wave antenna to the transmitter or the receiver at a given point in time.

According to one aspect of the invention, an RF frontend IC device includes a first transceiver to transmit and receive RF signals associated with a first RF channel according to a first amplitude and phase shift setting within a predetermined frequency band. The RF frontend IC device further includes a second transceiver to transmit and receive RF signals associated with a second RF channel according to a second amplitude and phase shift setting within the predetermined frequency band. The second amplitude and phase shift setting may be different from the first amplitude and phase shift setting. The RF frontend IC device further includes a frequency synthesizer coupled to the first transceiver and the second transceiver to perform frequency synchronization in a wide frequency spectrum. The frequency synthesizer generates an LO signal to the first transceiver and the second transceiver to enable the first transceiver and the second transceiver to transmit and receive the RF signals associated with the first RF channel and the second RF channel respectively. The first transceiver, the second transceiver, and the frequency synthesizer are embedded within a single IC chip.

According to one embodiment, the RF signals associated with the first RF channel are to be transmitted and received via a first antenna configured to radiate and receive according to the first amplitude and phase shift setting. The RF signals associated with the second RF channel are to be transmitted and received via a second antenna configured to radiate and receive according to the second amplitude and phase shift setting.

In one embodiment, each of the first transceiver and the second transceiver includes a transmitter to transmit a first RF signal to a first remote device, a receiver to receive a second RF signal from a second remote device, and a switch coupled to the transmitter and the receiver. The switch is configured to couple the transmitter or the receiver to an antenna associated with the transceiver at a given point in time.

In one embodiment, the transmitter includes a first intermediate frequency (IF) in-phase and quadrature (IQ) generator (IFIQ generator) to generate an IFIQ signal based on an IF signal received from a modem or a baseband processor. The transmitter further includes a first LO IQ (LOIQ) generator to generate an LOIQ signal based on the LO signal received from the frequency synthesizer. The transmitter further includes a first mixer coupled to the first IFIQ generator and the first LOIQ generator to generate the first RF signal based on the IFIQ signal and the LOIQ signal.

In one embodiment, each transceiver further includes a first IF amplifier coupled to the first IFIQ generator and the first mixer. The first IF amplifier is configured to amplify the IFIQ signal and to provide the amplified IFIQ signal to the first mixer. Each transceiver further includes a first broadband amplifier (also referred to as an RF amplifier) coupled to the first mixer to amplify the first RF signal received from the first mixer.

In one embodiment, the first IF amplifier includes a second IF amplifier to receive and amplify an in-phase IF signal derived from the IFIQ signal. The in-phase IF signal is mixed with an in-phase LO signal derived from the LOIQ signal. The first IF amplifier further includes a third IF amplifier to receive and amplify a quadrature IF signal derived from the IFIQ signal. The quadrature IF signal is mixed with a quadrature LO signal derived from the LOIQ signal.

In one embodiment, the receiver includes a second broadband/RF amplifier configured to receive the second RF signal, a second LOIQ generator to generate an LOIQ signal based on the LO signal received from the frequency synthesizer, and a second mixer coupled to the second broadband amplifier and the second LOIQ generator. The second mixer is configured to generate an IFIQ signal based on the amplified second RF signal and the LOIQ signal. The receiver further includes a fourth IF amplifier coupled to the second mixer to receive and amplify the IFIQ signal from the second mixer. The receiver further includes an IFIQ combiner coupled to the fourth IF amplifier to generate a combined IF signal based on the IFIQ signal.

In one embodiment, the fourth IF amplifier includes a fifth IF amplifier to receive and amplify an in-phase IF signal derived from the IFIQ signal and a sixth IF amplifier to receive and amplify a quadrature IF signal derived from the IFIQ signal. The IFIQ combiner is configured to combine the in-phase IF signal and the quadrature IF signal to generate a combined IF signal.

According to another aspect of the invention, an RF frontend IC device includes an array of transceivers, each of the transceivers corresponding to one of the RF channels. Each of the RF channels includes a phase shifter configured to transmit and receive RF signals according to a respective phase shift setting within a predetermined frequency band, including shifting or compensating a phase of the RF signals according to the respective phase shift setting. The RF frontend IC device further includes a frequency synthesizer coupled to each of the transceivers to perform frequency synchronization in a wide frequency spectrum. The frequency synthesizer generates an LO signal for each of the transceivers to enable each of the transceivers to transmit and receive RF signals within its respective RF channel. The RF frontend IC device further includes an up-converter coupled to each of the transceivers and the frequency synthesizer. The up-converter is configured to up-convert a first intermediate frequency (IF) signal based on a LO signal into a first RF signal to be transmitted by the transceivers. The RF frontend IC device further includes a down-converter coupled to each of the transceivers and the frequency synthesizer. The down-converter is configured to down-convert a second RF signal received from the transceivers based on the LO signal into a second IF signal. The array of transceivers, the frequency synthesizer, the up-converter, and the down-converter are embedded within a single IC chip.

In one embodiment, the up-converter includes an IFIQ generator to receive the first IF signal, an LOIQ generator to receive the LO signal from the frequency synthesizer to generate an LOIQ signal based on the LO signal, and an up-convert mixer coupled to the IFIQ generator and the LOIQ generator. The up-convert mixer is configured to generate the first RF signal based on the first IF signal and the LOIQ signal. In one embodiment, the up-converter further includes an IF amplifier coupled between the IFIQ generator and the up-convert mixer to amplify the first IF signal. The up-converter further includes a power divider coupled to the up-convert mixer to divide the first RF signal into a number of first RF sub-signals. Each first RF sub-signal is provided to one of the transceivers to be transmitted.

In one embodiment, the down-converter includes an LOIQ generator to receive the LO signal from the frequency synthesizer to generate an LOIQ signal based on the LO signal, a down-convert mixer coupled to the LOIQ generator. The down-convert mixer is configured to generate an IFIQ signal based on the second RF signal received from the transceivers and the LOIQ signal. The down-converter further includes an IFIQ combiner to generate the second IF signal based on the IFIQ signal received from the down-convert mixer. In one embodiment, the down-converter further includes a power combiner coupled between the down-convert mixer and the transceivers. The power combiner is configured to combine second RF sub-signals received from the transceivers to generate the second RF signal, each second RF sub-signal corresponding to one of the transceivers. The down-converter further includes an IF amplifier coupled between the IFIQ combiner and the down-convert mixer to amplify the IFIQ signal.

In one embodiment, each of the transceivers includes a transmitter to transmit RF signals to a first remote device, a receiver to receive RF signals from a second remote device, and a switch configured to couple the transmitter or the receiver to one of the antennas at a given point in time, where each of the antennas corresponds to one of the transceivers.

According to a further aspect of the invention, an RF frontend IC device includes a frequency synthesizer having a PLL circuit and an LO buffer to generate an LO signal based on a clock signal, an IFIQ generator to receive a first IF signal from a modem or a baseband processor to generate a first IFIQ signal, and an IFIQ combiner to generate a second IF signal based on a second IFIQ signal. The second IF signal will be processed by the modem or baseband processor. The RF frontend IC device further includes a number of transceivers coupled to the frequency synthesizer. Each of the transceivers is associated with one of the RF channels that is configured to transmit and receive RF signals according to one of the amplitude and phase shift setting within a predetermined frequency band.

In one embodiment, each of the transceivers includes a transmitter coupled to the frequency synthesizer to up-convert the first IFIQ signal using the LO signal to a first RF signal to be transmitted to a first remote device. Each transceiver further includes a receiver coupled to the frequency synthesizer to down-convert a second RF signal received from a second remote device using the LO signal to the second IFIQ signal. The transceivers, the frequency synthesizer, the IFIQ generator, and the IFIQ combiner are embedded within a single IC chip.

In one embodiment, the transmitter includes a phase shifter to receive the LO signal from the frequency synthesizer and to shift the LO signal according to a predetermined shifted phase, an LOIQ generator to generate an LOIQ signal based on the LO signal shifted in phase, and an up-convert mixer to generate the first RF signal based on a first intermediate frequency (IF) signal received from a modem or a baseband processor and the LOIQ signal.

In one embodiment, the receiver includes a phase shifter to receive the LO signal from the frequency synthesizer and to shift the LO signal according to a predetermined shifted phase, an LOIQ generator to generate an LOIQ signal based on the LO signal shifted in phase, and an down-convert mixer to generate the second IFIQ signal based on the second RF signal and the LOIQ signal. In one embodiment, each of the transceivers further includes a switch coupled to the transmitter and the receiver. The switch is configured to couple the transmitter or the receiver to an antenna associated with the corresponding transceiver at a given point in time.

FIG. 1 is a block diagram illustrating an example of a wireless communication device according one embodiment of the invention. Referring to FIG. 1, wireless communication device 100, also simply referred to as a wireless device, includes, amongst others, an mm-wave frontend module 101 (also simply referred to as an RF frontend module) and a modem or a baseband processor 102. A modem may include an IF-to-baseband frequency (IF/BF) down-converter, a BF/IF up-converter, and a baseband processor (e.g., a digital processing processor or DSP). Wireless device 100 can be any kind of wireless communication devices such as, for example, mobile phones, laptops, tablets, network appliance devices (e.g., Internet of thing or TOT appliance devices), etc. Alternatively, wireless device 100 may represent a basestation or cellular tower, etc.

In a radio receiver circuit, an RF frontend, such as an mm-wave RF frontend, is a generic term for all the circuitry between the antenna up to and including the mixer stage. It consists of all the components in a receiver that processes the signals at the original incoming RF frequency, before they are converted to a lower intermediate frequency. In microwave and satellite receivers it is often called the low-noise block (LNB) or low-noise downconverter (LND) and is often located at or near an antenna, so that the signals from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes an array of RF transceivers (e.g., mm-wave RF transceivers). Each of the RF transceivers transmits and receives coherent RF signals (e.g., mm-wave signals) within a particular frequency band (e.g., a particular range of frequencies such as non-overlapped frequency ranges) via one of a number of mm-wave antennas. In mm-wave technology, MM waves occupy the frequency spectrum ranging from 30 GHz to 300 GHz. The frontend IC chip 101 further includes a full-band or wideband frequency synthesizer coupled to the RF transceivers. The wideband frequency synthesizer generates and provides a local oscillator (LO) signal to each of the RF transceivers to enable the RF transceiver to mix, modulate, and/or demodulate RF signals within a wide frequency band (e.g., 24-43 GHz). The array of RF transceivers and the wideband frequency synthesizer may be integrated within a single IC chip as a single RF frontend IC chip or package.

Note that for the purposes of illustration only, an mm-wave frontend module is utilized as an example of an RF frontend module. Similarly, an mm-wave transceiver is utilized as an example of an RF transceiver. However, the techniques described throughout this application can also be applicable to other RF circuits in other frequency spectrums or frequency bands.

Figure 2:
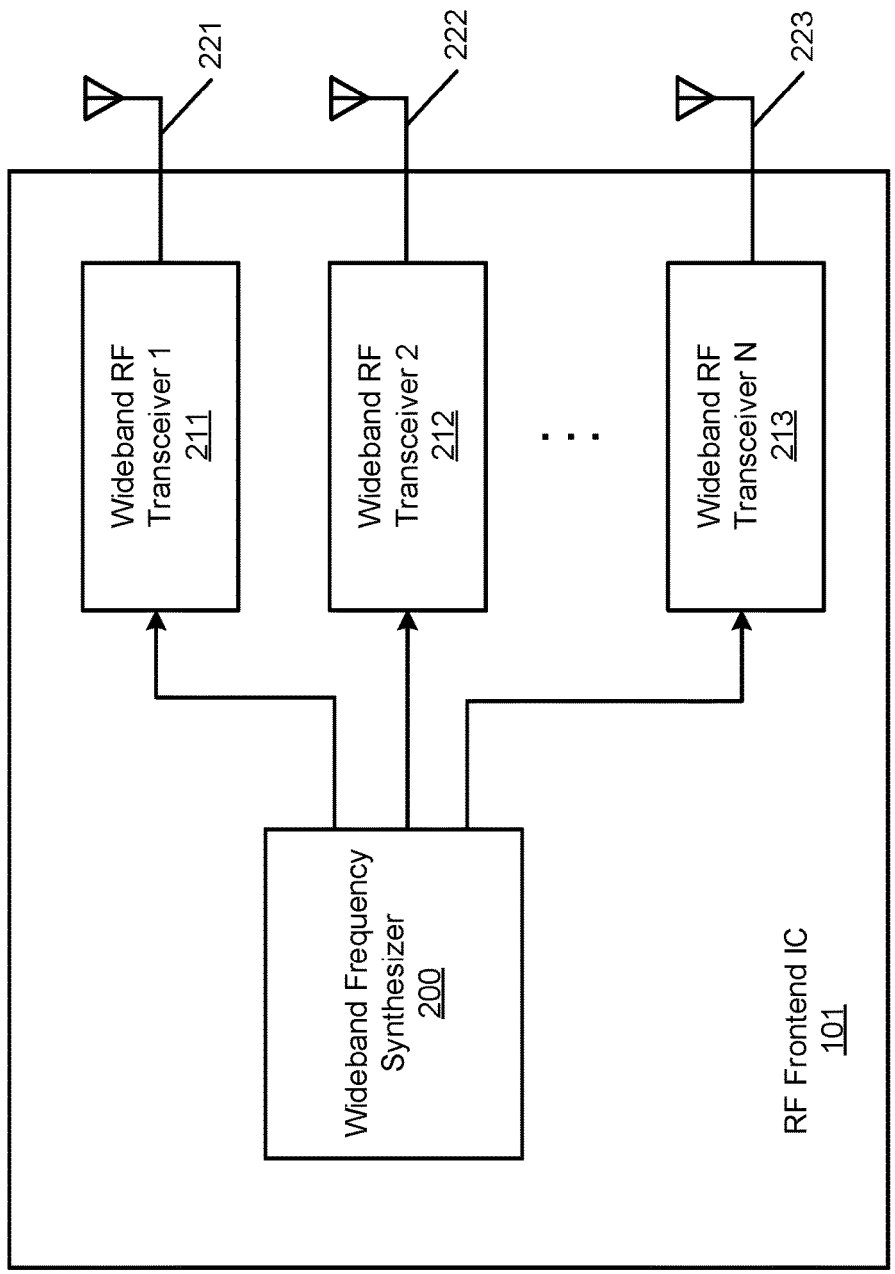
FIG. 2 is a block diagram illustrating an example of an RF frontend integrated circuit according to one embodiment of the invention.

FIG. 2 is a block diagram illustrating an example of an RF frontend integrated circuit according to one embodiment of the invention. RF frontend IC device 101 may be an mm-wave frontend IC device. Referring to FIG. 2, RF frontend 101 includes, amongst others, a wideband or full-band frequency synthesizer 200 coupled to an array of RF transceivers 211-213. Each of RF transceivers 211-213 is configured to transmit and receive coherent RF signals such as mm-wave signals with variable amplitudes and phase shifts via one of mm-wave antennas 221-223. By providing proper amplitude and phase shift settings for each of the transceivers 221-223, the entire transceiver array can steer one or multiple beams in the desired directions (referred to as beaming directions, or radiation angles or radiation directions). In one embodiment, each of transceivers 211-213 is configured to receive an LO signal from wideband frequency synthesizer 200. The LO signal is generated for a specific frequency band (e.g., 24-43 GHz band). The LO signal is utilized to mix, modulate, demodulate by each of transceivers 221-223 for the purpose of transmitting and receiving mm-wave signals within the corresponding frequency band.

Alternatively, each of RF transceivers 221-223 may be associated with a different frequency band, such as non-overlapped or minimum overlapped frequency ranges. Each transceiver is configured to transmit and receive RF signals within the corresponding frequency band using a specific LO signal for the corresponding frequency band, which is generated by frequency synthesizer 200.

Figure 3:
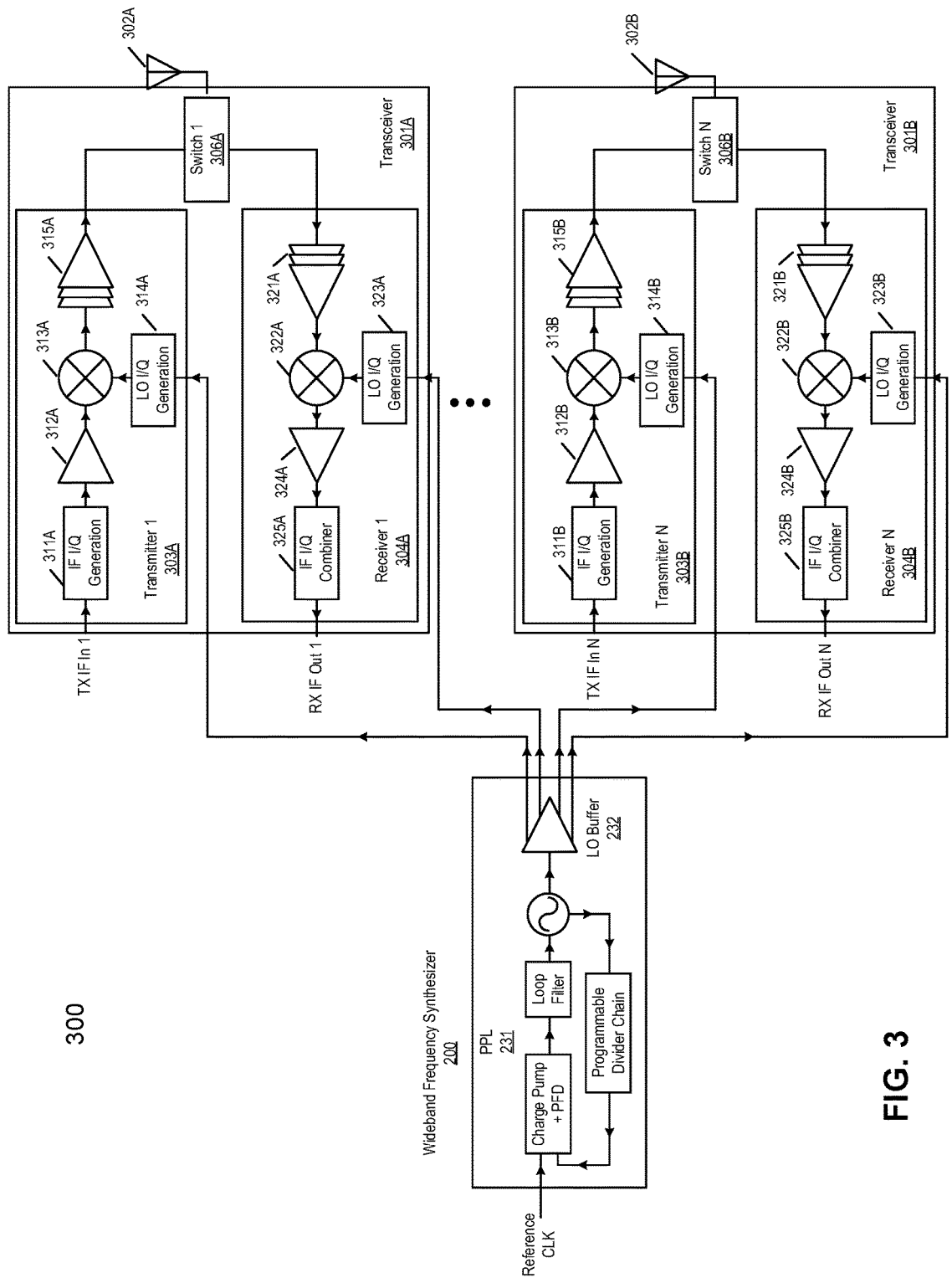
FIG. 3 is a schematic diagram illustrating an example of an RF frontend integrated circuit according to one embodiment of the invention.

FIG. 3 is a block diagram illustrating an example of an RF frontend integrated circuit according to one embodiment of the invention. RF frontend IC device 300 may represent RF frontend IC device 101 of FIG. 2. Referring to FIG. 3, in one embodiment, RF frontend IC device 300 includes frequency synthesizer 200 and an array of RF transceivers 301A-301B, collectively referred to as transceiver(s) 301. Although there are two RF transceivers 301A-301B shown, more RF transceivers may be included. Frequency synthesizer 200 is configured to generate an LO signal for each of the transceivers 301 to allow each transceiver to modulate or demodulate RF signals onto and from a carrier frequency signal to be transmitted to and received from a remote device. Each of transceivers 301 is associated with an antenna, such as antennas 302A-302B (collectively referred to as antenna(s) 302). Antennas 302 may be located at different locations of a mobile device that can transmit and receive RF signals according to a particular beaming direction or angle.

In this embodiment, RF frontend IC device 300 includes a first transceiver 301A to transmit and receive RF signals associated with a first RF channel according to a first RF amplitude and phase shift setting within a predetermined frequency band. The RF frontend IC device 300 further includes a second transceiver 301B to transmit and receive RF signals associated with a second RF channel according to a second RF amplitude and phase shift setting within the predetermined frequency band. The second RF amplitude and phase shift setting may be different from the first RF amplitude and phase shift setting. The RF frontend IC device 300 further includes a frequency synthesizer 200 coupled to the first transceiver 301A and the second transceiver 301B to perform frequency synchronization in a wide frequency spectrum. The frequency synthesizer 200 generates an LO signal to the first transceiver 301A and the second transceiver 301B to enable the first transceiver 301A and the second transceiver 301B to transmit and receive the RF signals associated with the first RF channel and the second RF channel respectively. The first transceiver 301A, the second transceiver 301B, and the frequency synthesizer 200 are embedded within a single IC chip 300.

According to one embodiment, the RF signals associated with the first RF channel are to be transmitted and received via a first antenna 302A configured to radiate and receive according to the first RF amplitude and phase shift setting, and the RF signals associated with the second RF channel are to be transmitted and received via a second antenna 302B configured to radiate and receive according to the second RF amplitude and phase shift setting. Note that antennas 302 may not be a part of RF frontend IC device 300.

In one embodiment, each of the first transceiver 301A and the second transceiver 301B includes a transmitter (e.g., transmitters 303A-303B, collectively referred to as transmitter(s) 303) to transmit a first RF signal to a first remote device, a receiver (e.g., receivers 304A-304B, collectively referred to as receiver(s) 304) to receive a second RF signal from a second remote device, and a switch (e.g., switches 306A-306B, collectively referred to as switch(es) 306) coupled to the transmitter and the receiver. A switch is configured to couple a transmitter or a receiver to an antenna associated with the transceiver at a given point in time. That is, at any given point in time only one of the transmitter or the receiver can be coupled to a corresponding antenna.

In one embodiment, each of transmitters 303 includes a first IFIQ generator, such as IFIQ generators 311A-311B, to generate an IFIQ signal based on an IF signal received from a modem or a baseband processor. Each transmitter further includes a first LOIQ generator (e.g., LOIQ generators 314A-314B) to generate an LOIQ signal based on the LO signal received from the frequency synthesizer 200. Each transmitter further includes a first mixer (e.g., mixers 313A-313B, collectively referred to as up-convert mixer(s) 313) coupled to the first IFIQ generator and the first LOIQ generator to generate the first RF signal based on the IFIQ signal and the LOIQ signal.

In one embodiment, each of transceivers 301 further includes a first IF amplifier (e.g., IF amplifiers 312A-312B, collectively referred to as IF amplifiers or amplifier 312) coupled to the first IFIQ generator and the first mixer. The first IF amplifier is configured to amplify the IFIQ signal and to provide the amplified IFIQ signal to the first mixer. Each of transceivers 301 further includes a first broadband amplifier (e.g., broadband or RF amplifiers 315A-315B, collectively referred to as broadband or RF amplifiers or amplifier 315) coupled to the first mixer to amplify the first RF signal received from the first mixer.

In one embodiment, each of the receivers 304 includes a second broadband amplifier (e.g., RF amplifiers 321A-321B, collectively referred to as RF amplifiers or amplifier 321) configured to receive the second RF signal. Each receiver further includes a second LOIQ generator (e.g., LOIQ generators 323A-323B, collectively referred to as LOIQ generator(s) 323) to generate an LOIQ signal based on the LO signal received from the frequency synthesizer 200. Each receiver further includes a second mixer (e.g., mixers 322A-322B, collectively referred to as down-convert mixer(s) 322) coupled to the second broadband amplifier and the second LOIQ generator. The second mixer is configured to generate an IFIQ signal based on the amplified second RF signal and the LOIQ signal. Each receiver further includes a fourth IF amplifier (e.g., IF amplifiers 324A-324B, collectively referred to as IF amplifiers or amplifier 324) coupled to the second mixer to receive and amplify the IFIQ signal from the second mixer. Each receiver further includes an IFIQ combiner (e.g., IFIQ combiners 325A-325B, collectively referred to as IFIQ combiner(s) 325) coupled to the fourth IF amplifier to generate a combined IF signal based on the IFIQ signal.

In one embodiment, frequency synthesizer 200 includes a phase lock loop (PLL) circuitry 231 to generate the LO signal associated with the predetermined frequency band based on a clock reference signal, and an LO buffering device 232 coupled to the PLL circuitry to buffer and to provide a first LO signal and a second LO signal derived from the LO signal to the first transceiver and the second transceiver respectively.

A PLL is a control system that generates an output signal whose phase is related to the phase of an input signal. While there are several differing types, it is easy to initially visualize as an electronic circuit consisting of a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop. Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Figure 4:
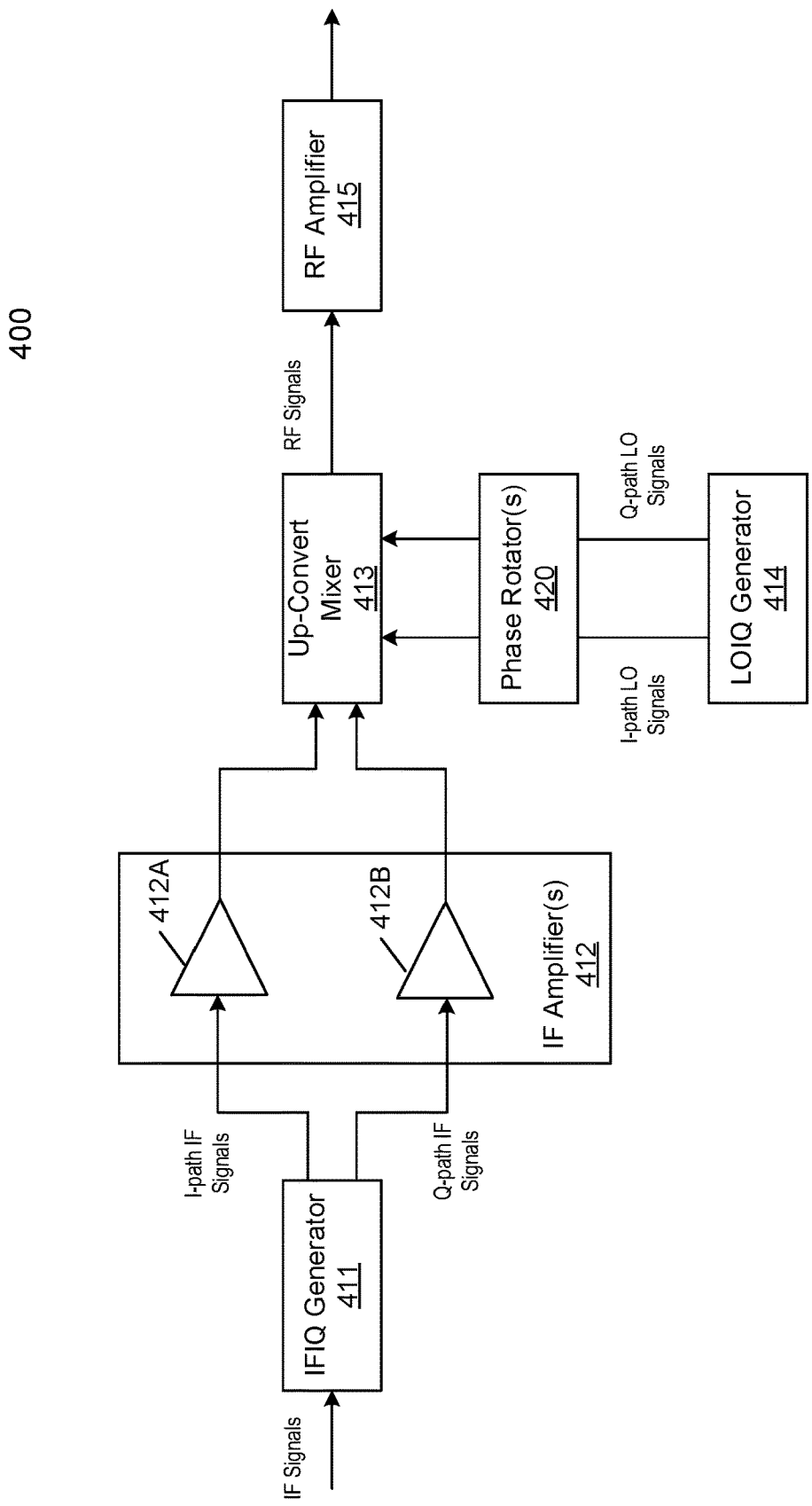
FIG. 4 is a schematic diagram illustrating an example of a transmitter according to one embodiment of the invention.

FIG. 4 is a schematic diagram illustrating an example of a transmitter according to one embodiment. Transmitter 400 may represent any of the transmitters of any of the transceivers as described above, such as transmitters 303 of FIG. 3. Referring to FIG. 4, transmitter 400 includes an IFIQ generator 411, IF amplifier 412 having IF amplifier 412A and IF amplifier 412B, mixer 413, LOIQ generator 414, RF amplifier 415, and phase rotator(s) or phase shifter(s) 420.

In one embodiment, the IF amplifier 412 may represent IF amplifiers 312, which includes a second IF amplifier 412A and a third IF amplifier 412B. IFIQ generator 411 is configured to generate an in-phase (also referred to as I-path) IF signal and a quadrature (also referred to as Q-path) IF signal. The I-path IF signal and the Q-path IF signal are then amplified by a respective IF amplifier such as IF amplifiers 412A-412B. In one embodiment, LOIQ generator 414 is configured to generate an I-path LO signal and a Q-path LO signal.

The I-path LO signal and the Q-path LO signal may be shifted in phase by phase rotator 420. Phase rotator 420 may include a first phase rotator to shift in phase the I-path LO signal and a second phase rotator to shift in phase the Q-path LO signal. In one embodiment, the I-path IF signal and the Q-path IF signal are mixed with I-path LO signal and Q-path LO signal respectively and up-converted from IF to RF by up-convert mixer 413 to generate an RF signal. The RF signal can then be amplifier by an RF amplifier 415 to be transmitted to a remote device via an associated antenna.

Figure 5:
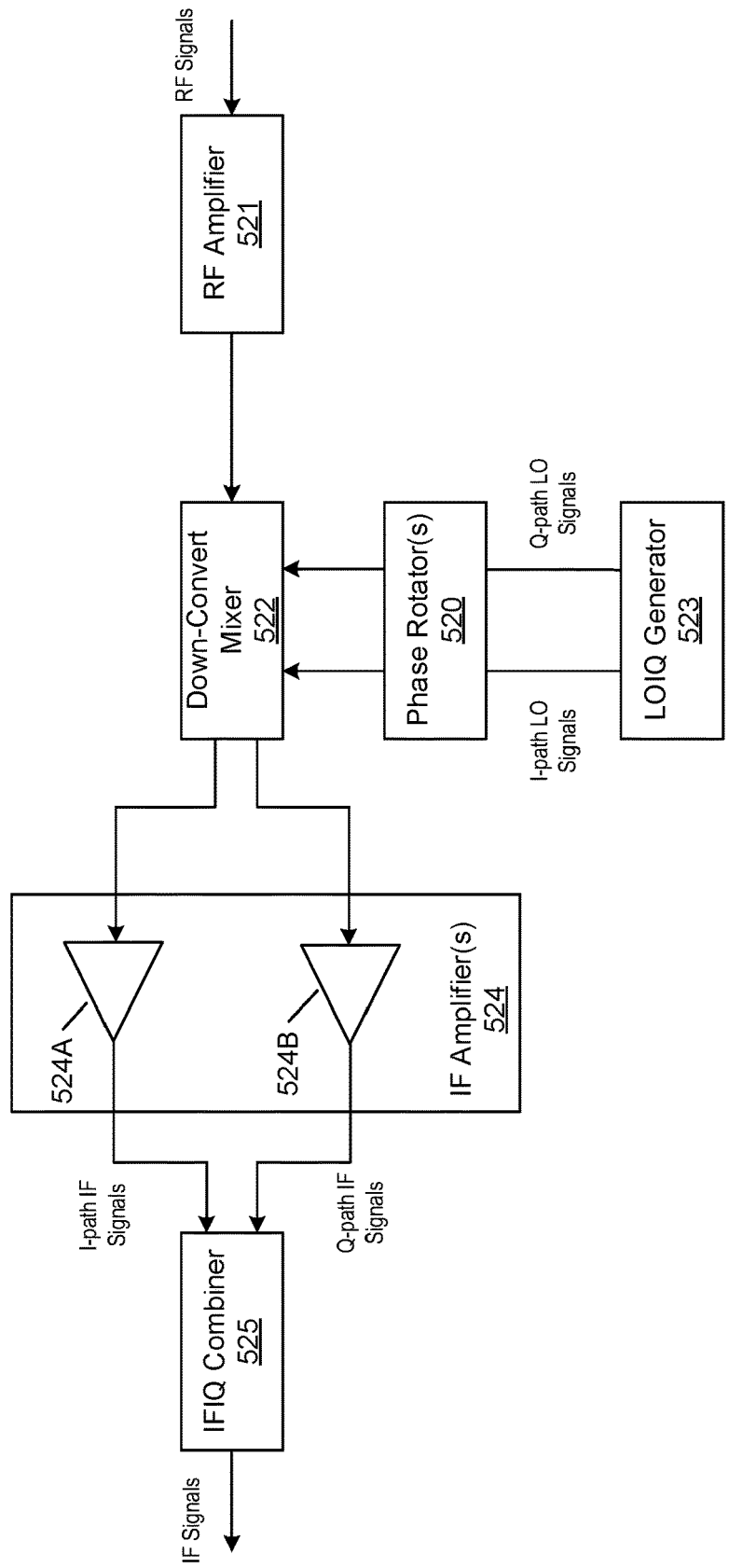
FIG. 5 is a schematic diagram illustrating an example of a receiver according to one embodiment of the invention.

FIG. 5 is a schematic diagram illustrating an example of a receiver according to one embodiment. Receiver 500 may represent any of the receivers of any of the transceivers as described above, such as receivers 304 of FIG. 3. Referring to FIG. 5, in one embodiment, receiver 500 includes a phase rotator or shifter 520, an RF amplifier 521, a down-convert mixer 522, an LOIQ generator 523, an IF amplifier 524 having IF amplifier 424A and IF amplifier 424B, and an IFIQ combiner 525.

In one embodiment, LOIQ generator 523 generates or splits an LO signal received from a frequency synthesizer (e.g., frequency synthesizer 200) into an I-path LO signal and a Q-path LO signal. The I-path LO signal and the Q-path LO signal may be shifted or rotated in phase by phase rotator or phase shifter 520. Phase rotator 520 may include a first phase rotator to shift the I-path LO signal and a second phase rotator to shift the Q-path LO signal. The RF signal received from an antenna may be amplified by RF amplifier 521 and mixed with the shifted I-path LO signal and shifted Q-path LO signal and down converted from RF to IF by down-convert mixer 522 to generate an I-path IF signal and a Q-path IF signal. The I-path IF signal and the Q-path IF signal are then amplified by IF amplifiers 524A-524B respectively. The amplified I-path IF signal and Q-path IF signal are then combined by IFIQ combiner 525 to generate an IF signal to be processed by a modem or a baseband processor, where the IF signal includes having both in-phase components and quadrature components.

Referring back to FIG. 3, in this embodiment, each of transceivers 301 is configured to transmit and receive RF signals within the same frequency or same frequency band. However, each of transceivers 301 is configured to transmit and receive the RF signals with different amplitude and phase shift settings. Each of antennas 302 is connected to one RF transceiver to transmit or receive RF signals at a predetermined beaming direction.

In this embodiment, each of the transceivers 301 includes its own IFIQ generator/combiner, up/down convert mixer, and LOIQ generator. Specifically, each transmitter of each transceiver includes its own IFIQ generator, up-convert mixer, and LOIQ generator. Each receiver of each transceiver includes its own IFIQ combiner, down-convert mixer, and LOIQ generator. The streams of IF signals down converted and processed by the receivers are then processed by a modem or a baseband processor, for example, in a digital domain. The IF signals in different amplitudes and phases may be further down converted into BF signals, which may then be processed by a digital processor by combining the BF signals with amplitude and phase compensation to boost the strength or amplitude of the BF signals. Alternatively, the amplitude and phase compensation may be performed at the IF level prior to the IF signals being down converted to BF signals.

Figure 6:
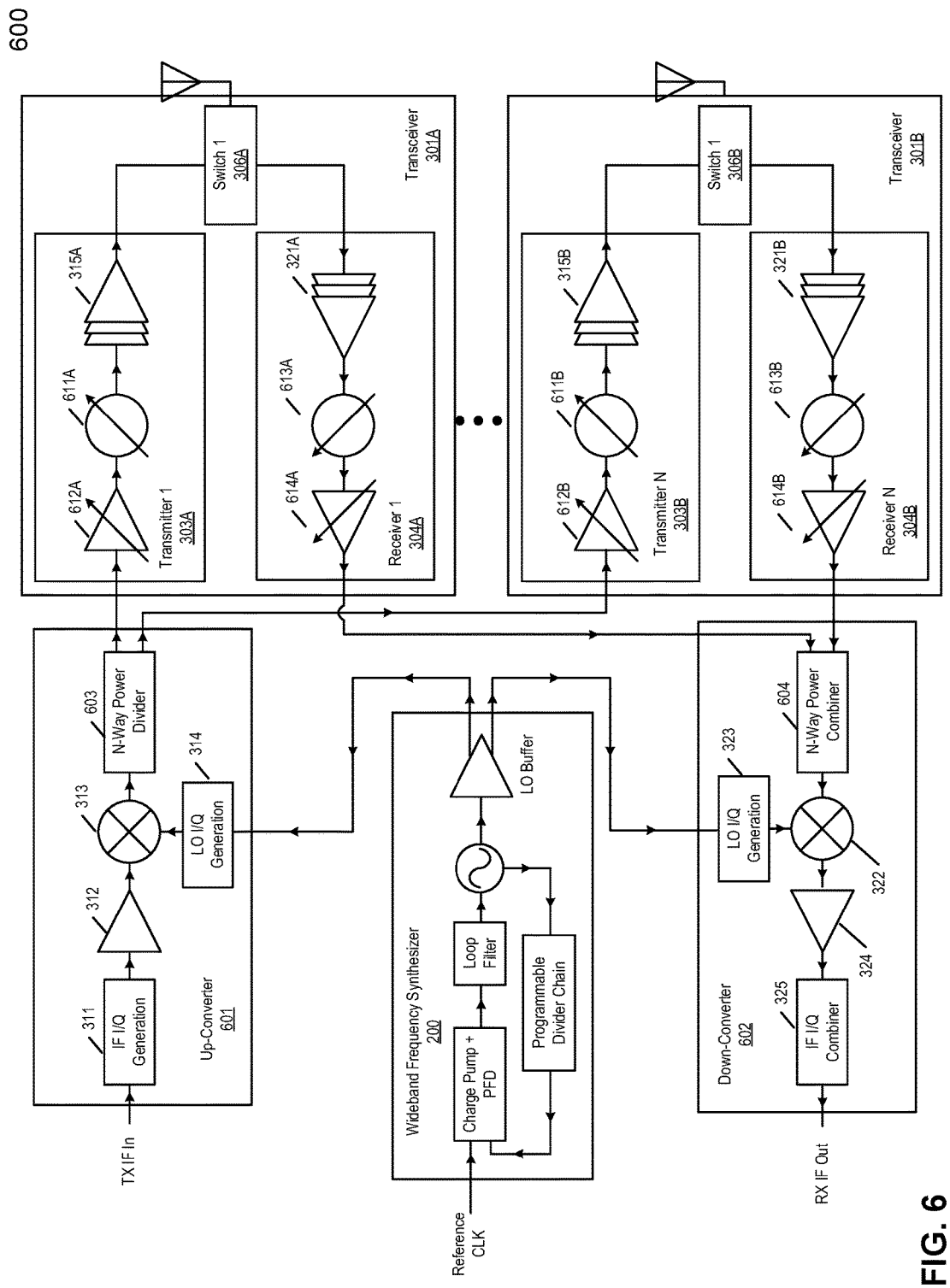
FIG. 6 is a schematic diagram illustrating an example of an RF frontend integrated circuit according to another embodiment of the invention.

FIG. 6 is a schematic diagram illustrating an example of an RF frontend IC device according to another embodiment. RF frontend IC device 600 may represent RF frontend IC device 101 as described above. In one embodiment, RF frontend IC device 600 includes an array of transceivers 301, each of the transceivers 301 corresponding to one of the RF channels. Each of the RF transceivers 301 includes a phase shifter configured to transmit and receive RF signals according to a respective beam direction within a predetermined frequency band. The RF frontend IC device further includes a frequency synthesizer 200 coupled to each of the transceivers 301 to perform frequency synchronization in a wide frequency spectrum. The frequency synthesizer 200 generates an LO signal for each of the transceivers 301 to enable each of the transceivers 301 to transmit and receive the RF signals within its respective RF channel.

The RF frontend IC device 600 further includes an up-converter 601 coupled to each of the transceivers 301 and the frequency synthesizer 200. The up-converter 601 is configured to up-convert a first IF signal based on a LO signal into a first RF signal to be transmitted by the transceivers 301. The RF frontend IC device 600 further includes a down-converter 602 coupled to each of the transceivers 301 and the frequency synthesizer 200. The down-converter 602 is configured to down-convert a second RF signal received from the transceivers 301 based on the LO signal into a second IF signal. The array of transceivers 301, the frequency synthesizer 200, the up-converter 601, and the down-converter 602 are embedded within a single IC chip.

In one embodiment, the up-converter 601 includes an IFIQ generator 311 to receive the first IF signal, an LOIQ generator 314 to receive the LO signal from the frequency synthesizer 200 to generate an LOIQ signal based on the LO signal, and an up-convert mixer 313 coupled to the IFIQ generator 311 and the LOIQ generator 314. The up-convert mixer 313 is configured to generate the first RF signal based on the first IF signal and the LOIQ signal. In one embodiment, the up-converter 601 further includes an IF amplifier 312 coupled between the IFIQ generator 311 and the up-convert mixer 313 to amplify the first IF signal. The up-converter 601 further includes a power divider 603 coupled to the up-convert mixer 313 to divide the first RF signal into a number of first RF sub-signals, where each first RF sub-signal is provided to one of the transceivers 301 to be transmitted.

In one embodiment, the down-converter 602 includes an LOIQ generator 323 to receive the LO signal from the frequency synthesizer 200 to generate an LOIQ signal based on the LO signal, a down-convert mixer 322 coupled to the LOIQ generator 323. The down-convert mixer 322 is configured to generate an IFIQ signal based on the second RF signal received from the transceivers 301 and the LOIQ signal. The down-converter 602 further includes an IFIQ combiner 325 to generate the second IF signal based on the IFIQ signal received from the down-convert mixer 323. In one embodiment, the down-converter 602 further includes a power combiner 604 coupled between the down-convert mixer 322 and the transceivers 301. The power combiner 604 is configured to combine second RF sub-signals received from the transceivers 301 to generate the second RF signal, each second RF sub-signal corresponding to one of the transceivers 301. The down-converter 602 further includes an IF amplifier 324 coupled between the IFIQ combiner 325 and the down-convert mixer 322 to amplify the IFIQ signal.

In one embodiment, each of the transceivers 301 includes a transmitter (e.g., transmitters 303) to transmit RF signals to a first remote device, a receiver (e.g., receivers 304) to receive RF signals from a second remote device, and a switch (e.g., switches 306) configured to couple the transmitter or the receiver to one of the antennas 302 at a given point in time. Each of the antennas corresponds to one of the transceivers 301.

According to one embodiment, similar to RF frontend IC device 300 of FIG. 3, RF frontend IC device 600 includes a wideband frequency synthesizer 200 coupled to an array of transceivers 301A-301B. Each of transceivers 301 includes a transmitter (e.g., transmitters 303) and a receiver (e.g., receivers 304). However, in this embodiment, the IFIQ generators/combiners, up/down convert mixers, and LOIQ generators are removed from the transmitters 303 or the receivers 304 of transceivers 301. In one embodiment, an up-converter 601 and a down-converter 602 are utilized and shared by all of transceivers 301. The up-converter 601 includes an IFIQ generator, an up-convert mixer, and an LOIQ generator, whose functionalities and/or operations are identical or similar to those described above. The down-converter 602 includes an LOIQ generator, a down-convert mixer, and an IFIQ combiner, whose functionalities and/or operations are identical or similar to those described above.

On the transmission path, in one embodiment, up-converter 601 includes IFIQ generator 311, IF amplifier 312, up-convert mixer 313, and LOIQ generator 314 as described above. In addition, up-converter 601 further includes a power divider 603, in this example, an N-way power divider. Power divider 603 is configured to receive an RF signal from mixer 313 and to divide the RF signal into a number of RF signals with a lower power (e.g., 1/N of the original signal power as received from mixer 313, where N represents the number of transmitters 313), referred to as RF sub-signals. The RF sub-signals are then fed to transmitters 303 to be processed.

According to one embodiment, each of transmitters 303 includes a phase shifter (e.g., phase shifters 611A-611B, collectively referred to as phase shifter(s) 611). Similar to phase rotators 420 and 520 of FIGS. 4-5, the phase shifter is configured to shift a signal such as an RF beam is generated in the desired direction. In addition, each of transmitters 303 may include a variable gain amplifier (e.g., variable gain amplifiers 612A-612B, collectively referred to as variable gains amplifier(s) 612). Variable gain amplifier 612 is configured to compensate the amplitude variation due to the phase shifting operation by phase shifter 611. In one embodiment, in response to a specific shifted phase, variable gain amplifier 612 is configured to look up in a lookup table (not shown) based on the shifted phase to obtain a gain value and to adjust the gain of the variable gain amplifier 612 for amplitude compensation.

On the receiving path, in one embodiment, down-converter 602 includes a down-convert mixer 322, an LOIQ generator 323, an IF amplifier 324, and an IFIQ combiner 325. The functionalities and operations of down-convert mixer 322, LOIQ generator 323, IF amplifier 324, and IFIQ combiner 325 are identical or similar to those described above. In addition, down converter 602 includes a power combiner 604. In this embodiment, power combiner 604 is configured to combine the RF signals from all of the receivers 304, for example, by adding the power of the RF signals all together to boost the signal strength.

According to one embodiment, each of receivers 304 includes a phase shifter (e.g., phase shifters 613A-613B, collectively referred to as phase shifter(s) 613). The functionalities of operations phase shifters 613 are identical or similar to phase shifters 611. Each of receivers 304 may further include a variable gain amplifier (e.g., variable gain amplifiers 614A-614B, collectively referred to as variable gain amplifier(s) 614). The functionalities or operations of variable gain amplifiers 614 are identical or similar to variable gain amplifiers 612.

In this embodiment, since the functionalities of up-converter 601 and down converter 602 have been removed from transceivers 301 and shared by all transceivers 301, comparing to the configuration as shown in FIG. 3, the physical size and DC power consumption of the RF frontend IC device can be reduced. However, the lookup operations performed by variable gain amplifier 612 may introduce latency, which may affect the beam switching performance of the RF frontend IC device dependent upon the specific circumstances. In addition, the configuration shown in FIG. 3 is able to transmit or receive multiple beams simultaneously in the digital domain (multiple-input-multiple-output (MIMO) operation), while the configuration shown in FIG. 6 is only able to transmit or receive one beam at a given time.

Figure 7:
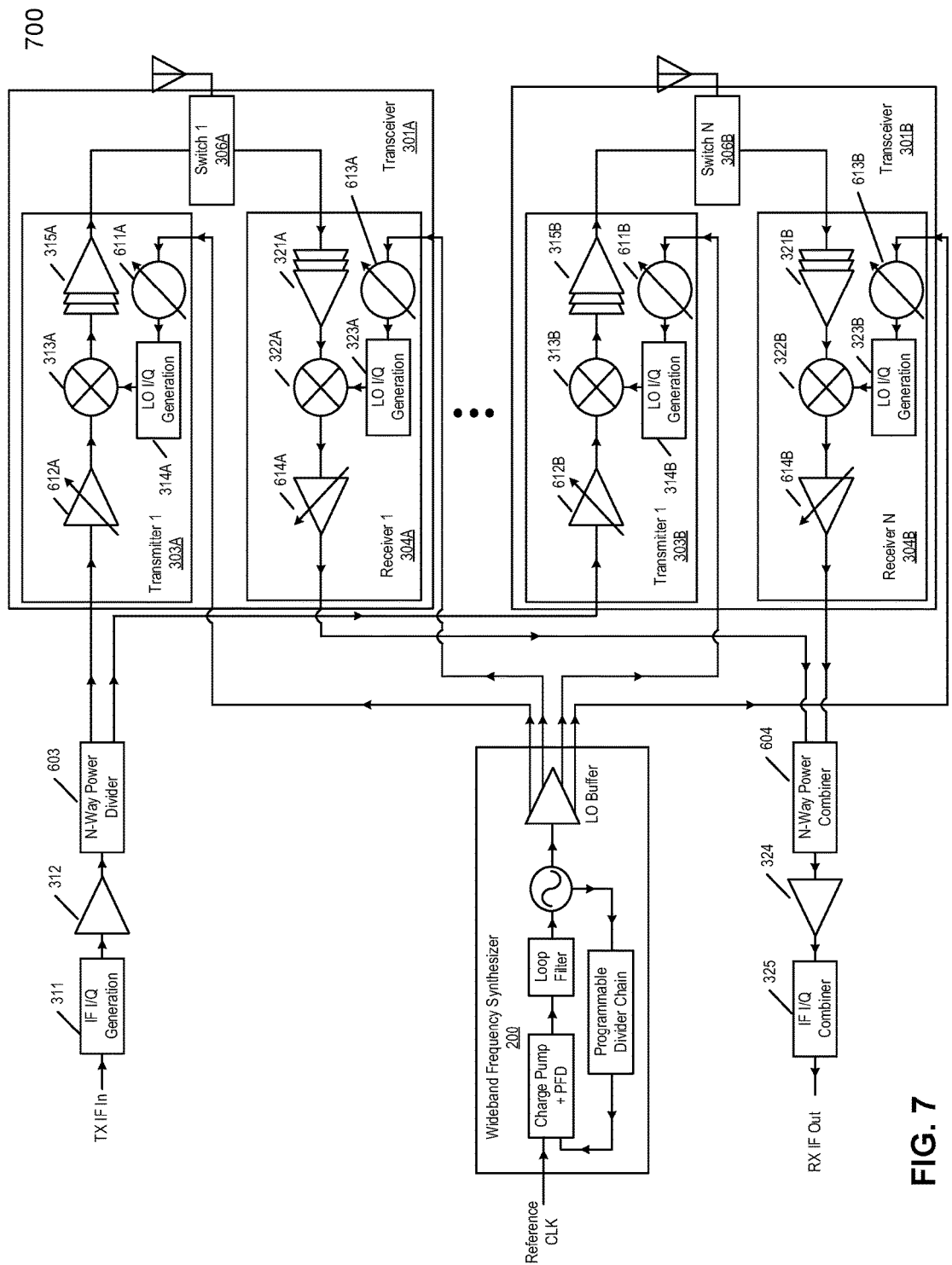
FIG. 7 is a block diagram illustrating an example of an RF frontend integrated circuit according to another embodiment of the invention.

FIG. 7 is a schematic diagram illustrating an example of an RF frontend IC device according to another embodiment. RF frontend IC device 700 may represent RF frontend IC device 101. According to one embodiment, RF frontend IC device 700 includes a frequency synthesizer 200 having a PLL circuit and an LO buffer to generate an LO signal based on a clock signal, an IFIQ generator 311 to receive a first IF signal from a modem or a baseband processor to generate a first IFIQ signal, and an IFIQ combiner 325 to generate a second IF signal based on a second IFIQ signal, the second IF signal to be processed by the modem or a baseband processor. The RF frontend IC device 700 further includes a number of transceivers 301 coupled to the frequency synthesizer 200. Each of the transceivers 301 is associated with one of the RF channels that is configured to transmit and receive RF signals according to one of the amplitude and phase shift settings within a predetermined frequency band (e.g., 24-43 GHz).

In one embodiment, each of the transceivers 301 includes a transmitter (e.g., transmitters 303) coupled to the frequency synthesizer 200 to up-convert the first IFIQ signal using the LO signal to a first RF signal to be transmitted to a first remote device, and a receiver (e.g., receivers 304) coupled to the frequency synthesizer 200 to down-convert a second RF signal received from a second remote device using the LO signal to the second IFIQ signal. The transceivers 301, the frequency synthesizer 200, the IFIQ generator 311, and the IFIQ combiner 325 may be embedded within a single IC chip.

In one embodiment, the transmitter 303 includes a phase shifter 611 to receive the LO signal from the frequency synthesizer 200 and to shift the LO signal according to a predetermined shifted phase, an LOIQ generator 314 to generate an LOIQ signal based on the LO signal shifted in phase, and an up-convert mixer 313 to generate the first RF signal based on a first intermediate frequency (IF) signal received from a modem or a baseband processor and the LOIQ signal.

In one embodiment, the receiver 304 includes a phase shifter 613 to receive the LO signal from the frequency synthesizer 200 and to shift the LO signal according to a predetermined shifted phase, an LOIQ generator 323 to generate an LOIQ signal based on the LO signal shifted in phase, and an down-convert mixer 322 to generate the second IFIQ signal based on the second RF signal and the LOIQ signal.

In this embodiment, since in general the conversion gain of mixers 313 and 322 is less affected by the LO signal amplitude as long as the LO signal is large enough, the gain variation of phase shifters 611 and 613 may not affect the conversion gain of mixers 313 and 322. As a result, variable gain amplifiers 612 and 614 may be optional. However, on the other hand, since each of transmitters 303 and receivers 304 includes a mixer, the power consumption of each transmitter and receiver may be higher compared with the configuration in FIG. 6.

Therefore, different embodiments as shown in FIGS. 3 and 6-7 can be utilized dependent upon the specific applications and/or IC layout limitations. RF frontend IC device 300 as shown in FIG. 3 may have the best flexibility amongst all. It also supports multiple beams simultaneously by processing the IF signal of each transceiver channel in the digital domain. However, RF frontend IC device 300 may require the largest footprint or size and DC power consumption. RF frontend IC device 600 as shown in FIG. 6 may have the smallest footprint or size of the chip and DC power consumption. However, it may require 2-dimentional calibration of the amplitude and phase shift settings when forming a beam at a particular direction, which may lead to high latency during beam switching. RF frontend IC device 700 as shown in FIG. 7 is between RF frontend IC device 300 and RF frontend IC device 600 in terms of DC power consumption and size of the IC chip.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) frontend integrated circuit (IC) device, the RF frontend IC device comprising:
    a first transceiver to transmit and receive RF signals associated with a first RF channel according to a first amplitude and phase shift setting within a predetermined frequency band;
    a second transceiver to transmit and receive RF signals associated with a second RF channel according to a second amplitude and phase shift setting within the predetermined frequency band, wherein the second amplitude and phase shift setting is different from the first amplitude and phase shift setting; and
    a frequency synthesizer coupled to the first transceiver and the second transceiver to perform frequency synchronization in a wide frequency spectrum, wherein the frequency synthesizer generates a local oscillator (LO) signal to the first transceiver and the second transceiver to enable the first transceiver and the second transceiver to transmit and receive the RF signals associated with the first RF channel and the second RF channel respectively, and
    wherein the first transceiver, the second transceiver, and the frequency synthesizer are embedded within a single IC chip.

2. The RF frontend IC device of claim 1, wherein the RF signals associated with the first RF channel are to be transmitted and received via a first antenna configured to radiate and receive according to the first amplitude and phase shift setting, and wherein the RF signals associated with the second RF channel are to be transmitted and received via a second antenna configured to radiate and receive according to the second amplitude and phase shift setting.

3. The RF frontend IC device of claim of claim 1, wherein each of the first transceiver and the second transceiver comprises:
    a transmitter to transmit a first RF signal to a first remote device;
    a receiver to receive a second RF signal from a second remote device; and
    a switch coupled to the transmitter and the receiver, wherein the switch is configured to couple the transmitter or the receiver to an antenna associated with the transceiver at a given point in time.

4. The RF frontend IC device of claim 3, wherein the transmitter comprises:
    a first intermediate frequency (IF) in-phase and quadrature (IQ) generator (IFIQ generator) to generate an IFIQ signal based on an IF signal received from a modem or a baseband processor;
    a first LO IQ (LOIQ) generator to generate an LOIQ signal based on the LO signal received from the frequency synthesizer; and
    a first mixer coupled to the first IFIQ generator and the first LOIQ generator to generate the first RF signal based on the IFIQ signal and the LOIQ signal.

5. The RF frontend IC device of claim 4, wherein each of the first and second transceivers further comprises:
    a first IF amplifier coupled to the first IFIQ generator and the first mixer, wherein the first IF amplifier is configured to amplify the IFIQ signal and to provide the amplified IFIQ signal to the first mixer; and
    a first broadband amplifier coupled to the first mixer to amplify the first RF signal received from the first mixer.

6. The RF frontend IC device of claim 5, wherein the first IF amplifier comprises:
    a second IF amplifier to receive and amplify an in-phase IF signal derived from the IFIQ signal, wherein the in-phase IF signal is mixed with an in-phase LO signal derived from the LOIQ signal; and
    a third IF amplifier to receive and amplify a quadrature IF signal derived from the IFIQ signal, wherein the quadrature IF signal is mixed with a quadrature LO signal derived from the LOIQ signal.

7. The RF frontend IC device of claim 3, wherein the receiver comprises:
    a second broadband amplifier configured to receive the second RF signal;
    a second LOIQ generator to generate an LOIQ signal based on the LO signal received from the frequency synthesizer; and
    a second mixer coupled to the second broadband amplifier and the second LOIQ generator, wherein the second mixer is configured to generate an IFIQ signal based on the amplified second RF signal and the LOIQ signal.

8. The RF frontend IC device of claim 7, wherein the receiver further comprises:
    a fourth IF amplifier coupled to the second mixer to receive and amplify the IFIQ signal from the second mixer; and
    an IFIQ combiner coupled to the fourth IF amplifier to generate a combined IF signal based on the IFIQ signal.

9. The RF frontend IC device of claim 8, wherein the fourth IF amplifier comprises:
    a fifth IF amplifier to receive and amplify an in-phase IF signal derived from the IFIQ signal; and
    a sixth IF amplifier to receive and amplify a quadrature IF signal derived from the IFIQ signal, wherein the IFIQ combiner is configured to combine the in-phase IF signal and the quadrature IF signal to generate the combined IF signal.

10. The RF frontend IC device of claim 1, wherein the frequency synthesizer comprises:
   a phase lock loop (PLL) circuitry to generate the LO signal associated with the predetermined frequency band based on a clock reference signal; and
   an LO buffering device coupled to the PLL circuitry to buffer and to provide a first LO signal and a second LO signal derived from the LO signal to the first transceiver and the second transceiver respectively.

11. A radio frequency (RF) frontend integrated circuit (IC) device, the RF frontend IC device comprising:
   an array of transceivers, each of the transceivers corresponding to one of a plurality of RF channels, wherein each of the RF channels includes a phase shifter configured to transmit and receive RF signals according to a respective phase shift setting within a predetermined frequency band, including shifting or compensating a phase of the RF signals according to the respective phase shift setting;
   a frequency synthesizer coupled to each of the transceivers to perform frequency synchronization in a wide frequency spectrum, wherein the frequency synthesizer generates a local oscillator (LO) signal for each of the transceivers to enable each of the transceivers to transmit and receive the RF signals within its respective RF channel;
   an up-converter coupled to each of the transceivers and the frequency synthesizer, wherein the up-converter is configured to up-convert a first intermediate frequency (IF) signal based on a LO signal into a first RF signal to be transmitted by the transceivers; and
   a down-converter coupled to each of the transceivers and the frequency synthesizer, wherein the down-converter is configured to down-convert a second RF signal received from the transceivers based on the LO signal into a second IF signal,
   wherein the array of transceivers, the frequency synthesizer, the up-converter, and the down-converter are embedded within a single IC chip.

12. The RF frontend IC device of claim 11, wherein the up-converter comprises:
   an IF in-phase and quadrature (IQ) generator (IFIQ generator) to generate an IFIQ signal based on the first IF signal;
   an LOIQ generator to receive the LO signal from the frequency synthesizer to generate an LOIQ signal based on the LO signal; and
   an up-convert mixer coupled to the IFIQ generator and the LOIQ generator, wherein the up-convert mixer is configured to generate the first RF signal based on the IFIQ signal and the LOIQ signal.

13. The RF frontend IC device of claim 12, wherein the up-converter further comprises:
   an IF amplifier coupled between the IFIQ generator and the up-convert mixer to amplify the first IF signal; and
   a power divider coupled to the up-convert mixer to divide the first RF signal into a plurality of first RF sub-signals, wherein each first RF sub-signal is provided to one of the transceivers to be transmitted.

14. The RF frontend IC device of claim 11, wherein the down-converter comprises:
   an LOIQ generator to receive the LO signal from the frequency synthesizer to generate an LOIQ signal based on the LO signal;
   a down-convert mixer coupled to the LOIQ generator, wherein the down-convert mixer is configured to generate an IFIQ signal based on the second RF signal received from the transceivers and the LOIQ signal; and
   an IFIQ combiner to generate the second IF signal based on the IFIQ signal received from the down-convert mixer.

15. The RF frontend IC device of claim 14, wherein the down-converter further comprises:
   a power combiner coupled between the down-convert mixer and the transceivers, wherein the power combiner is configured to combine a plurality of second RF sub-signals received from the transceivers to generate the second RF signal, each second RF sub-signal corresponding to one of the transceivers; and
   an IF amplifier coupled between the IFIQ combiner and the down-convert mixer to amplify the IFIQ signal.

16. The RF frontend IC device of claim 11, wherein each of the transceivers comprises
   a transmitter to transmit RF signals to a first remote device;
   a receiver to receive RF signals from a second remote device; and
   a switch configured to couple the transmitter or the receiver to one of a plurality of antennas at a given point in time, wherein each of the antennas corresponds to one of the transceivers.

17. A radio frequency (RF) frontend integrated circuit (IC) device, the RF frontend IC device comprising:
   a frequency synthesizer having a phase-lock loop (PLL) and a local oscillator (LO) buffer to generate an LO signal based on a clock signal;
   an IF in-phase and quadrature (IQ) generator (IFIQ generator) to receive a first IF signal from a modem or a baseband processor to generate a first IFIQ signal;
   an IFIQ combiner to generate a second IF signal based on a second IFIQ signal, the second IF signal to be processed by the modem or a baseband processor; and
   a plurality of transceivers coupled to the frequency synthesizer, wherein each of the transceivers is associated with one of a plurality of RF channels that is configured to transmit and receive RF signals according to one of a plurality of amplitude and phase shift settings within a predetermined frequency band, wherein each of the transceivers comprises:
      a transmitter coupled to the frequency synthesizer to up-convert the first IFIQ signal using the LO signal to a first RF signal to be transmitted to a first remote device, and
      a receiver coupled to the frequency synthesizer to down-convert a second RF signal received from a second remote device using the LO signal to the second IFIQ signal,
   wherein the plurality of transceivers, the frequency synthesizer, the IFIQ generator, and the IFIQ combiner are embedded within a single IC chip.

18. The RF frontend IC device of claim 17, wherein the transmitter comprises:
   a phase shifter to receive the LO signal from the frequency synthesizer and to shift the LO signal according to a predetermined shifted phase;
   an LO in-phase and quadrature (IQ) generator (LOIQ generator) to generate an LOIQ signal based on the LO signal shifted in phase; and an up-convert mixer to generate the first RF signal based on a first intermediate frequency (IF) signal received from a modem or a baseband processor and the LOIQ signal.

19. The RF frontend IC device of claim 17, wherein the receiver comprises:
a phase shifter to receive the LO signal from the frequency synthesizer and to shift the LO signal according to a predetermined shifted phase;
an LO in-phase and quadrature (IQ) generator (LOIQ generator) to generate an LOIQ signal based on the LO signal shifted in phase; and
an down-convert mixer to generate the second IFIQ signal based on the second RF signal and the LOIQ signal.

20. The RF frontend IC device of claim 17, wherein each of the transceivers comprises a switch coupled to the transmitter and the receiver, wherein the switch is configured to couple the transmitter or the receiver to an antenna associated with the corresponding transceiver at a given point in time.

* * * * *